United States Patent
Coy et al.

(10) Patent No.: US 11,189,992 B2
(45) Date of Patent: Nov. 30, 2021

(54) PULSED QUANTUM CASCADE DEVICE ASSEMBLY WITH ACTIVE VOLTAGE PULLDOWN

(71) Applicant: DAYLIGHT SOLUTIONS, INC., San Diego, CA (US)

(72) Inventors: Bruce Coy, San Diego, CA (US); Miles James Weida, Poway, CA (US)

(73) Assignee: DAYLIGHT SOLUTIONS, INC., San Diego, CA (US)

( * ) Notice: Subject to any disclaimer, the term of this patent is extended or adjusted under 35 U.S.C. 154(b) by 161 days.

(21) Appl. No.: 16/574,894

(22) Filed: Sep. 18, 2019

(65) Prior Publication Data

US 2020/0169064 A1   May 28, 2020

Related U.S. Application Data

(60) Provisional application No. 62/742,091, filed on Oct. 5, 2018.

(51) Int. Cl.
*H01S 5/34* (2006.01)
*H01S 5/042* (2006.01)
*H01S 5/068* (2006.01)
*H01S 5/026* (2006.01)

(52) U.S. Cl.
CPC .......... *H01S 5/3401* (2013.01); *H01S 5/0428* (2013.01); *H01S 5/06808* (2013.01); *H01S 5/026* (2013.01)

(58) Field of Classification Search
CPC .. H01S 5/3401; H01S 5/0287; H01S 5/34346; H01S 5/2215; H01S 5/3407; H01S 5/221; H01S 5/0206; H01S 5/068; H01S 5/06808
USPC ....................................... 372/43.01
See application file for complete search history.

(56) References Cited

U.S. PATENT DOCUMENTS

2015/0101234 A1* 4/2015 Priest .................... H01S 5/0428
                                                              42/114

OTHER PUBLICATIONS

Yong, K. S. C., et al., "An Equivalent Circuit for Quantum Cascade Lasers", Journal of Infrared, Millimeter, and Terahertz Waves 34 (10), 586-597 (2013).

(Continued)

*Primary Examiner* — Tuan N Nguyen
(74) *Attorney, Agent, or Firm* — Roeder & Broder LLP; Steven G. Roeder (57) ABSTRACT

A laser assembly (10) for generating a pulsed output beam (16) includes a quantum cascade device (12); and a laser driver (14A) that controls the voltage to the quantum cascade device (12) in a pulsed drive profile (950) to generate the pulsed output beam (16). The pulsed drive profile (950) includes a plurality of spaced on-time segments (952) in which the laser driver (14A) directs voltage to the quantum cascade device (12), and at least one off-time segment (954) in which the laser driver (14A) pulls down the voltage from the quantum cascade device (12). The off-time segment (954) occurs between two on-time segments (952).

10 Claims, 8 Drawing Sheets

(56) References Cited

OTHER PUBLICATIONS

Biswas, A. et al., "Equivalent circuit models of quantum cascade lasers for SPICE simulation of steady state and dynamic responses", Journal of Optics A: Pure and Applied Optics 9,26-32 (2007).
Wang, C. Y. et al., "Mode-locked pulses from mid-infared Quantum Cascade Lasers", Optics Express 15 (17), 12929-12943 (2009).
Kotidis, Petros, "Quantum-Cascade Lasers: QCLs enable applications in IR spectroscopy," Laser Focus World, Jan. 1, 2013.

* cited by examiner

PULSED QUANTUM CASCADE DEVICE ASSEMBLY WITH ACTIVE VOLTAGE PULLDOWN

RELATED APPLICATION

This application claims priority on U.S. Provisional Application No. 62/742,091 filed on Oct. 5, 2018, and entitled "PULSED QUANTUM CASCADE DEVICE ASSEMBLY WITH ACTIVE VOLTAGE PULLDOWN". As far as permitted, the contents of U.S. Provisional Application No. 62/742,091 are incorporated herein.

BACKGROUND

Infrared laser assemblies that produce an infrared output beam can be used in many fields such as medical diagnostics, pollution monitoring, leak detection, analytical instruments, homeland security, remote chemical sensing, and industrial process control.

One type of infrared laser assembly uses a quantum cascade device as a gain media, and a laser driver to direct voltage to the gain media. These quantum cascade devices generate photons through the injection of electrons into designed quantum wells by the laser driver.

In certain designs, the laser driver directs voltage to the quantum cascade device in a pulsed fashion to reduce thermal load and power consumption of the quantum cascade device. Unfortunately, even with the pulsed drive voltage, the heat generated by the quantum cascade device, and the power consumed by the quantum cascade device can be quite significant. Further, as the temperature of the quantum cascade device increases, the efficiency of the quantum cascade device decreases. As a result thereof, designers are always searching for ways to reduce the amount of heat generated and the power consumed by the quantum cascade device.

SUMMARY

The present invention is directed to a laser assembly that generates a pulsed output beam. The laser assembly can include a quantum cascade device; and a laser driver that controls the voltage to the quantum cascade device in a pulsed drive profile to generate the pulsed output beam. In one embodiment, the pulsed drive profile includes a plurality of spaced on-time segments in which the laser driver directs voltage to the quantum cascade device, and at least one off-time segment in which the laser driver pulls down the voltage from the quantum cascade device. In this embodiment, the off-time segment is between two on-time segments. With this design, the laser driver dramatically improves the slow decay of voltage when the quantum cascade device is nominally off in order to reduce thermal load and power consumption of the quantum cascade device. This will reduce the power consumption of the quantum cascade device and boost laser efficiency due to the cooler quantum cascade device.

As provided herein, the pulsed drive profile can include a plurality of spaced apart, off-time segments, and the off-time segments are interspersed between the on-time segments. During each of the off-time segments, the laser driver can pull down the voltage in the quantum cascade device to approximately zero volts. As used herein, in alternative non-exclusive embodiments, approximately zero volts shall mean less than 0.5, 0.2, 0.1, 0.05, or 0.01 volts.

In one embodiment, the laser driver includes a highside field-effect transistor (FET) driver that is used to control a highside switch for directing voltage to the quantum cascade device during each on-time segment, and a lowside field-effect transistor (FET) driver that is used to control a lowside switch when pulling down the voltage in the quantum cascade device during each off-time segment.

In another embodiment, the laser driver includes a metal-oxide-semiconductor field-effect transistor (MOSFET) driver for directing voltage to the quantum cascade device during each on-time segment, and pulling down the voltage in the quantum cascade device during each off-time segment.

The laser driver can include a power supply having a low dropout regulator optimized for fast transient response for directing voltage to the quantum cascade device during each on-time segment.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

DESCRIPTION

Figure 1A:
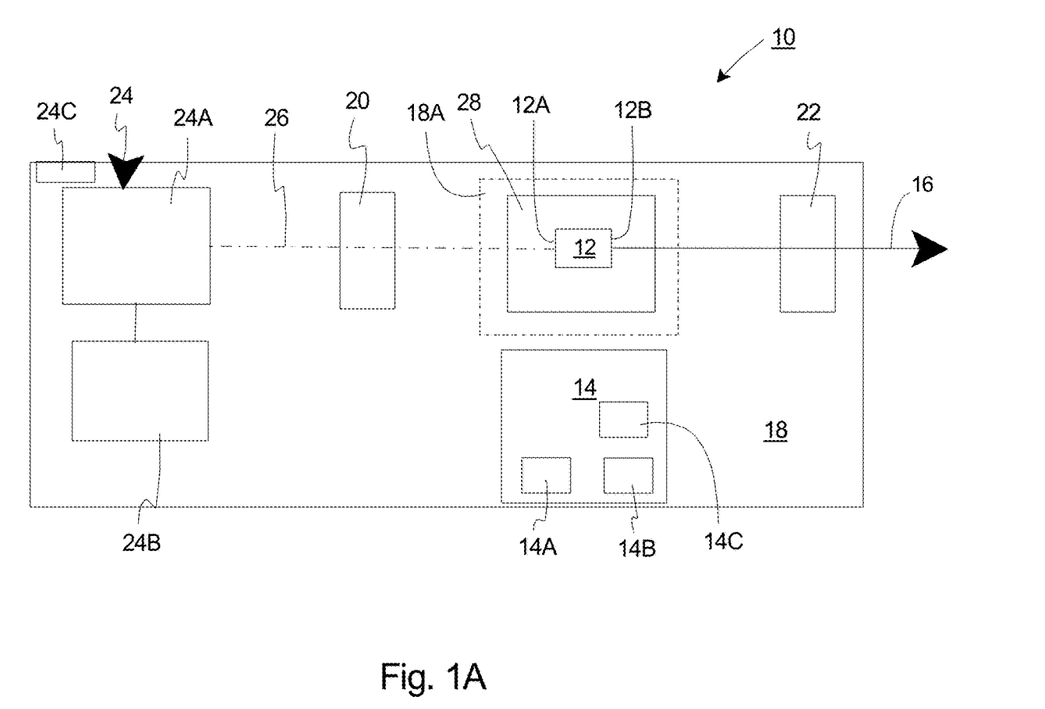
FIG. 1A is a simplified illustration of a laser assembly having features of the present invention.

FIG. 1A is a simplified, top illustration of a laser assembly 10 that includes a semi-conductor gain medium 12 and a laser controller 14. In one embodiment, the semi-conductor gain medium 12 is a quantum cascade device. With the present design, the quantum cascade device 12 emits an output beam 16 (light emitted) when the laser controller 14 directs sufficient voltage to the quantum cascade device 12.

As an overview, in certain embodiments, the laser controller 14 includes a laser driver 14A that directs and controls the voltage to the quantum cascade device 12 in a unique fashion that reduces the amount of heat generated and the power consumed by the quantum cascade device 12. For example, the laser driver 14A can control the voltage to the quantum cascade device 12 in a pulsed fashion that improves the slow decay of voltage when the quantum cascade device 12 is nominally off in order to reduce thermal load and power consumption of the quantum cascade device 12. This will reduce the power consumption of the quantum cascade device 12 and boost laser efficiency due to the cooler quantum cascade device 12.

The design of the laser assembly 10 can be varied to suit the requirements for the laser assembly 10. In one embodiment, the laser assembly 10 is designed to directly emit a substantially temporally coherent output beam 16 having a center wavelength in the mid-infrared ("MIR") range. As used herein, the term "MIR range" shall mean and include the spectral region or spectral band of between approximately five thousand to five hundred wavenumbers (5000-500 $cm^{-1}$), or approximately two and twenty micrometers (2-20 μm) in wavelength. The mid-infrared range is particularly useful to spectroscopically interrogate samples (not shown) that are comprised of molecules or groups of molecules that have fundamental vibrational modes in the MIR range, and thus present strong, unique absorption signatures within the MIR range.

In the non-exclusive embodiment illustrated in FIG. 1A, the laser assembly 10 is tunable so that a center wavelength of the output beam 16 is varied ("tuned") over time over a tunable wavelength range. Stated in another fashion, the laser assembly 10 can be tuned to different center wavelengths over time. In FIG. 1A, the tunable laser assembly 10 has an external cavity, Littrow configuration. As a non-exclusive example, the laser assembly can be designed to be tunable over the entire or just a portion of the MIR range.

In FIG. 1A, the laser assembly 10 also includes (i) a laser frame 18, (ii) a cavity optical assembly 20, (iii) an output optical assembly 22, and (v) a tunable frequency selective element assembly 24. The design of each of these components can be varied. Further, the laser assembly 10 can be designed with more or fewer components than illustrated in FIG. 1A.

The laser frame 18 supports one or more of the other components of the laser assembly 10 and maintains these components in alignment. In certain embodiments, the laser frame 18 is rigid and can include a temperature management system 18A (illustrated as a dashed box). For example, the temperature management system 18A can include a thermoelectric cooler and/or other devices for controlling the temperature of the components of the laser assembly 10.

The design of the quantum cascade device 12 can be varied pursuant to the teachings provided herein. The quantum cascade device 12 is a unipolar semiconductor laser that includes a series of energy steps built into the material matrix while the crystal is being grown. In one embodiment, the quantum cascade device 12 uses two different semiconductor materials such as InGaAs and AlInAs (grown on an InP or GaSb substrate for example) to form a series of potential wells and barriers for electron transitions. The thickness of these wells/barriers determines the wavelength characteristic of the quantum cascade device 12.

In one, non-exclusive embodiment, the quantum cascade device 12 directly emits the output beam 16 without any frequency conversion. In FIG. 1A, the quantum cascade device 12 includes (i) a first facet 12A that faces the cavity optical assembly 20 and the frequency selective element assembly 24, and (ii) a second facet 12B that faces the output optical assembly 22. In this embodiment, the quantum cascade device 12 emits from both facets 12A, 12B along a lasing axis 26. In one embodiment, the first facet 12A is coated with an anti-reflection ("AR") coating and the second facet 12B is coated with a reflective coating. The AR coating allows light directed from the quantum cascade device 12 at the first facet 12A to easily exit the quantum cascade device 12 as a beam directed at the frequency selective element assembly 24; and allows the beam reflected from the frequency selective element assembly 24 to easily enter the quantum cascade device 12.

The output beam 16 exits from the second facet 12B. The reflective coating on the second facet 12B reflects at least some of the light that is directed at the second facet 12B from the quantum cascade device 12 back into the quantum cascade device 12. In one non-exclusive embodiment, the AR coating can have a reflectivity of less than approximately 2 percent, and the reflective coating can have a reflectivity of between approximately 2-95 percent. In this embodiment, the reflective coating acts as an output coupler (e.g., a first end) for the external cavity.

In certain embodiments, the quantum cascade device 12 is positioned on a heat sink 28 that is in thermal communication with the temperature management system 18A. For example, the heat sink 28 can be made of material with a high thermal conductivity to more efficiently couple the quantum cascade device 12 to the temperature management system 18A. With this design, the heat sink 28 thermally connects the quantum cascade device 12 to the temperature control system 18A.

The cavity optical assembly 20 is positioned between the quantum cascade device 12 and the frequency selective element assembly 24 along the lasing axis 26, and collimates and focuses the light that passes between these components. For example, the cavity optical assembly 20 can include a single lens or more than one lens. For example, the lens can be an aspherical lens having an optical axis that is aligned with the lasing axis 26. In one embodiment, to achieve the desired small size and portability, the lens has a relatively small diameter. The lens can comprise materials selected from the group of Ge, ZnSe, ZnS, Si, CaF2, BaF2 or chalcogenide glass. However, other materials may also be utilized.

The output optical assembly 22 is positioned along the lasing axis 26. In this design, the output optical assembly 22 collimates and focuses the illumination beam 16 that exits the second facet 12B of the gain medium 12. For example, the output optical assembly 22 can include a single lens or more than one lens that are somewhat similar in design to the lens of the cavity optical assembly 20.

The frequency selective element assembly 24 reflects the light back to the quantum cascade device 12, and is used to precisely select and adjust the lasing frequency (wavelength) of the external cavity and the center optical wavelength of the output beam 16. Stated in another fashion, the frequency selective element assembly 24 is used to feed back to the quantum cascade device 12 a relatively narrow band optical frequency which is then amplified in the quantum cascade device 12. In this manner, the illumination beam 16 may be tuned with the frequency selective element assembly 24 without adjusting the quantum cascade device 12. Thus, with the external cavity arrangements disclosed herein, the frequency selective element assembly 24 dictates what optical frequency (wavelength) will experience the most gain and thus dominate the optical wavelength of the output beam 16.

A number of alternative embodiments of the frequency selective element assemblies 24 can be utilized. In FIG. 1A, the frequency selective element assembly 24 is spaced apart from the quantum cascade device 12 and defines a second end of the external cavity. In this embodiment, the external cavity extends from the output coupler (reflective coating) on the second facet 12B to the frequency selective element assembly 24.

In one, non-exclusive embodiment, the frequency selective element assembly 24 includes a diffraction grating 24A and a grating mover 24B (e.g. a voice coil actuator) that selectively moves (e.g., rotates) the diffraction grating 24A to selectively adjust the lasing wavelength of the quantum cascade device 12 and the center wavelength of the output beam 16. For example, the grating mover 24B can rapidly pivot the grating angle at a high rate (e.g. 30-1500 hertz) to adjust the center wavelength over time through the tunable wavelength range. The position of the diffraction grating 24A can be continuously monitored with a measurement system 24C (e.g. an optical encoder) that monitors the position of the diffraction grating 24A and provides for closed loop control of the grating mover 24B. With this design, the center wavelength of the output beam 16 can be selectively adjusted over time in a closed loop fashion.

Alternatively, for example, the frequency selective element assembly 24 can be an integrated distributed feedback grating (not shown) with electrically or thermally adjustable index of refraction, or another type of frequency selective element. A discussion of the techniques for realizing the full laser tuning range from a semiconductor device can be found in M. J. Weida, D. Caffey, J. A. Rowlette, D. F. Arnone and T. Day, "Utilizing broad gain bandwidth in quantum cascade devices", Optical Engineering 49 (11), 111120-111121-111120-111125 (2010). As far as permitted, the contents of this article are incorporated herein by reference.

The laser controller 14 controls the operation of the tunable laser assembly 10. As provided above, the laser controller 14 includes a laser driver 14A that directs and controls the voltage to the quantum cascade device 12 in a unique fashion that reduces the amount of heat generated and the power consumed by the quantum cascade device 12. More specifically, the laser driver 14A can control the voltage to the quantum cascade device 12 in a pulsed fashion ("pulsed drive profile") that improves the slow decay of voltage when the quantum cascade device 12 is nominally off in order to reduce thermal load and power consumption of the quantum cascade device 12. The laser driver 14A is described in more detail below.

Additionally, the laser controller 14 can include one or more processors 14B and/or one or more electronic storage devices 14C.

Moreover, in certain embodiments, the laser controller 14 can control the frequency selective element assembly 24 to control the center wavelength of the output beam 16. Stated in another fashion, the laser controller 14 can control the position of the diffraction grating 24A via the grating mover 24B so that the center wavelength of the output beam 16 is varied over time over the tunable wavelength range. For example, the laser assembly 10 can be tuned, and one or more pulses can be generated having approximately the same first center wavelength ("first target wavelength"). Subsequently, the laser assembly 10 can be tuned, and one or more pulses can be generated having approximately the same second center wavelength ("second target wavelength") that is different from the first center wavelength. Next, the laser assembly 10 can be tuned, and one or more pulses can be generated having approximately the same third center wavelength ("third target wavelength") that is different from the first and second target wavelengths. This process can be repeated to a plurality of additional target wavelengths throughout a portion or the entire tunable wavelength range. As non-exclusive examples, the number of pulses at each discrete target wavelength can be 1, 5, 10, 50, 100, 200, 500, 1000, 10,000 or more.

The number of discrete target wavelengths can also vary. As non-exclusive examples, the number of discrete target wavelengths can be approximately 1, 2, 3, 4, 5, 6, 7, 8, 9, 10, 15, 20, 25, 40, 200, 226, 400, 552 or 4000 within the tunable wavelength range.

As non-exclusive examples, the laser controller 14 can control the frequency selective element 24 so that the sweep rates across the entire tunable wavelength range is less than 1 millisecond, 10 millisecond, 100 millisecond, 1 second, 10 seconds, or 100 seconds.

Figure 1B:
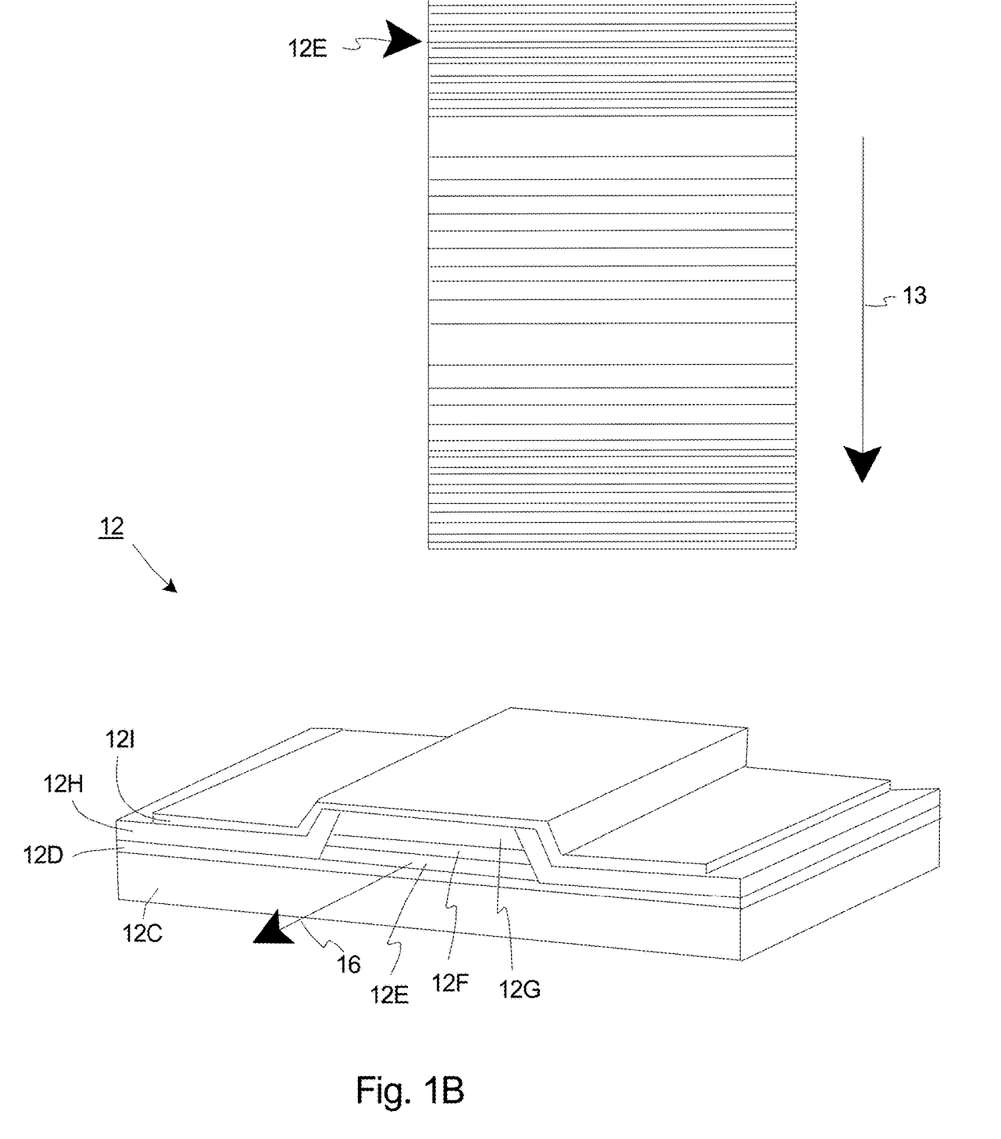
FIG. 1B is a simplified schematic of a quantum cascade device from FIG. 1A, including an inset magnification of an active region of the quantum cascade device.

FIG. 1B is a simplified schematic, cross-section of one, non-exclusive implementation of the quantum cascade device 12. The quantum cascade device 12 emits the output beam 16 (light emitted) when the laser driver 14 (illustrated in FIG. 1A) directs sufficient voltage to the quantum cascade device 12. The design of the quantum cascade device 12 can vary. In the non-exclusive embodiment illustrated in FIG. 1B, moving from the bottom upward, the quantum cascade device 12 includes (i) a rigid substrate 12C (e.g. made of Indium Phosphide ("InP")); (ii) a lower waveguide layer 12D (e.g. made of Indium Gallium Arsenic ("InGaAs")) positioned on top of the substrate 12C; (iii) an active region 12E positioned on top of the lower waveguide layer 12D; (iv) an upper waveguide layer 12F (e.g. made of InGaAs) positioned on top of the active region 12E; (v) a cladding layer 12G (e.g. made of InP) positioned on top of the upper waveguide layer 12F; (vi) a pair of isolation layers 12H positioned on sides of the active region 12E, the upper waveguide layer 12F, and the cladding layer 12G, and on top of a portion of the lower waveguide layer 12D; and (vii) a contact layer 12I (e.g. made of titanium ("Ti") and/or gold ("Au")) positioned on top of the cladding layer 12G and the isolation layers 12H. It should be noted that the design and the materials utilized in the Quantum cascade device 12 can be different than the example described above.

FIG. 1B also includes an inset illustrating an enlarged view of a portion of the active region 12E. Moving down through the active region 12E (denoted by the arrow 13), when the laser driver 14A (illustrated in FIG. 1A) directs voltage to the quantum cascade device 12, the electrons encounter different layers of semiconductor. Changes in semiconductor type and doping create variations in the electron potential energy through the active region 12E that result in quantum wells (as discussed below with reference to FIG. 2).

The active region 12E consists of alternating bands of different semiconductor materials with different dopings that are built up in a regular pattern to generate a series of quantum wells. With this design, current is driven down through the stack of layers from the top cladding layer 12G, through the active layers 12E, then down into a semiconductor substrate 12C. Infrared radiation 16 is then emitted from the end facets 12A, 12B (illustrated in FIG. 1A) of this quantum cascade device 10.

Figure 2:
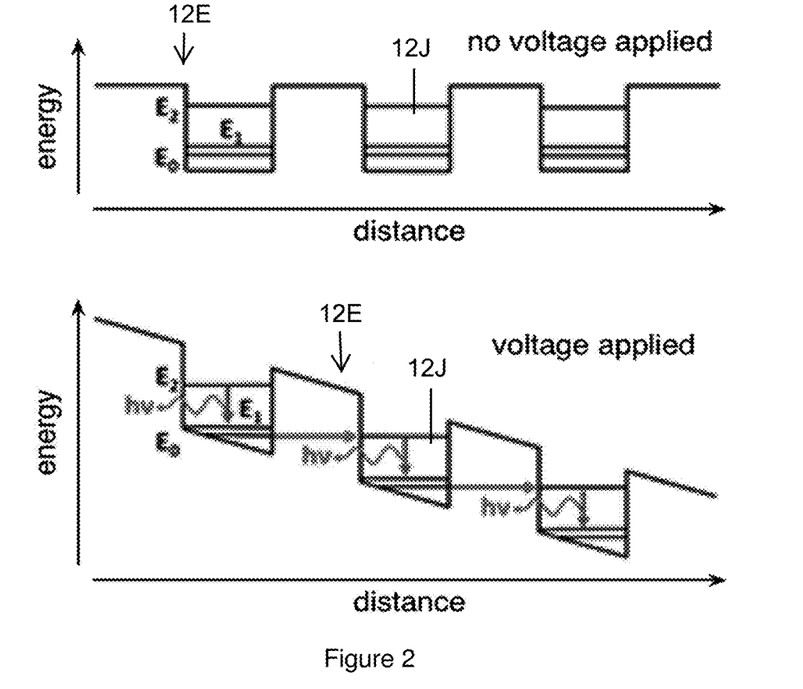
FIG. 2 includes a pair of simplified illustrations that demonstrate how photon generation and current conduction occur in the quantum cascade device.

FIG. 2 illustrates how photon generation and current conduction occur in a quantum cascade device 12 similar to that illustrated in FIG. 1B. More specifically, a top part of FIG. 2 is a simplified schematic of the active area 12E when no voltage is applied to the active area 12E, and a bottom part of FIG. 2 is a simplified schematic of the active area 12E when sufficient voltage is applied to the active area 12E.

As shown in the top part of FIG. 2, the alternating layers in the active region 12C of the quantum cascade device 12 create a series of quantum wells 12J (only three are illustrated in each part of FIG. 2) with distance into the active region 12C. These wells 12J have defined energy levels (based on quantum physics) that electrons can reside in. With reference to the top part of FIG. 2, initially if there is no voltage applied across the active region 12C, the flow of electrons is dictated by the resistivity of the semiconductor materials. However, with reference to the bottom part of FIG. 2, if a voltage is applied to the active region 12C, it skews the quantum well structure. Now, with the skewed quantum well structure, it is possible for an electron to enter one well 12J, drop its energy through the release of a photon, then tunnel into the next quantum well 12J. This can continue through the entire set of quantum wells 12J, creating multiple photons and multiple drops in energy. Hence the name quantum cascade.

Stated in another fashion, when no voltage is applied to the active region 12E, the electrons experience a resistance that is dictated by the semiconductor properties alone. However, when a voltage in the correct range is applied across the active area 12E, the electron energy levels in the quantum wells 12J line up such that electrons can move more easily through the active area 12E by releasing energy in the form of photons. Thus, there is a fundamental change in transport methods through the active region 12E based on the two different voltage modes.

Figure 3:
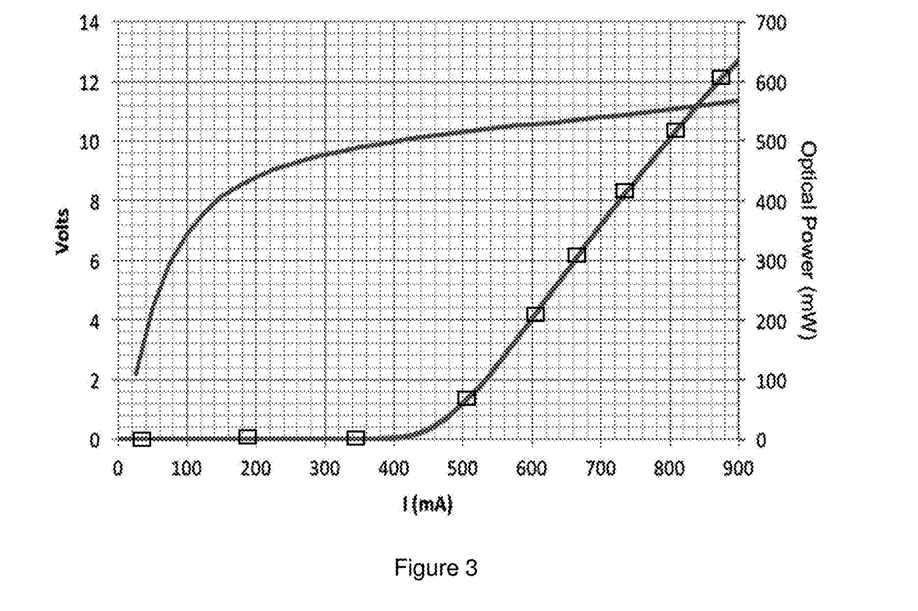
FIG. 3 is a graph that illustrates measured voltage across an active area of quantum cascade device active area as function of drive current, and the resulting optical power out.

FIG. 3 is a graph that illustrates measured voltage across the active area of the quantum cascade device as a function of drive current (solid line), and the resulting optical power out (solid line with squares). As illustrated in FIG. 3, if the voltage across the active region is plotted as a function of current through the device, the behavior is not linear. More specifically, initially the voltage rise is steep, followed by a leveling off. Further, the presence of optical power out of the quantum cascade device does not occur until some threshold current, at which point the quantum cascade structure illustrated in the bottom part of FIG. 2 has come into play.

Figure 4:
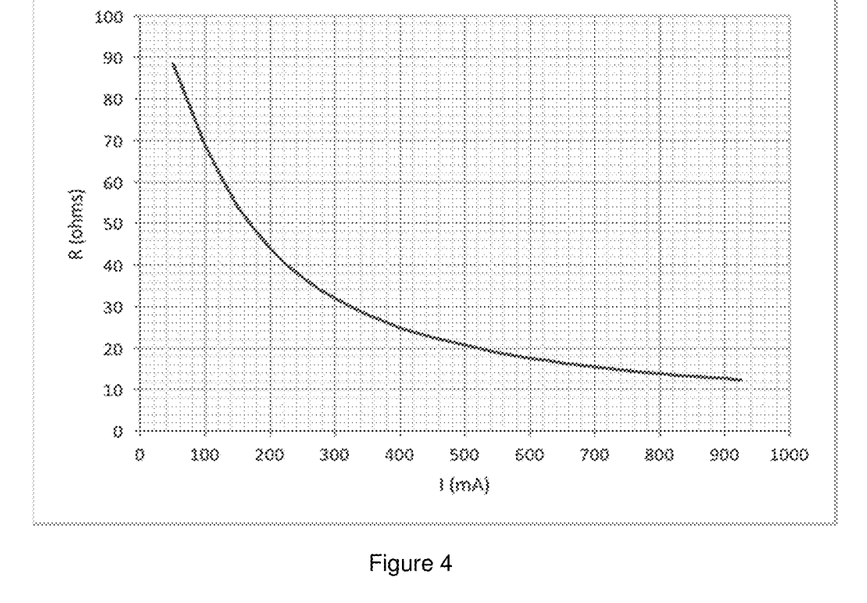
FIG. 4 is a graph that illustrates effective resistance across the active area of the quantum cascade device as a function of drive current.

FIG. 4 is a graph that illustrates effective resistance across the active area of the quantum cascade device as a function of drive current. As illustrated in FIG. 4, as the current through the active area increases, the effective resistance of the active area decreases. Thus, the effective resistance of the active area changes with the current through the active area, and the resistance across the active area is lower for higher current. This is because the electron movement in the active area changes from pure resistive movement for the low voltage regime to the more efficient tunneling and photon emission of the quantum cascade regime.

Figure 5:
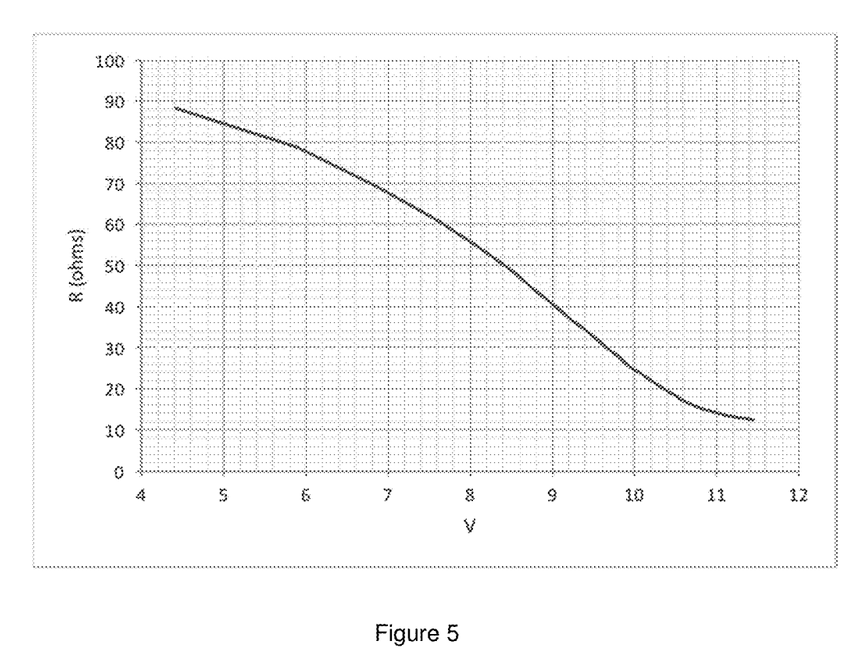
FIG. 5 is a graph that illustrates effective resistance across the active area of the quantum cascade device as a function of voltage.

FIG. 5 is a graph that illustrates effective resistance across the active area of the quantum cascade device as a function of voltage. As illustrated in FIG. 5, as the voltage through the active area increases, the effective resistance of the active area decreases. Thus, the effective resistance of the active area also changes with the voltage through the active area, and the resistance across the active area is lower for higher voltages.

The dependence of resistance on voltage leads to interesting behavior of for the quantum cascade device when operated in a pulsed fashion. With reference to FIGS. 3 and 5, if the quantum cascade device is driven at a sufficiently high repetition rate, light is emitted only during the high voltage portion of the pulse, but as the driving voltage for the pulse decreases, the resistance also increases, slowing down the voltage drop.

Figure 6:
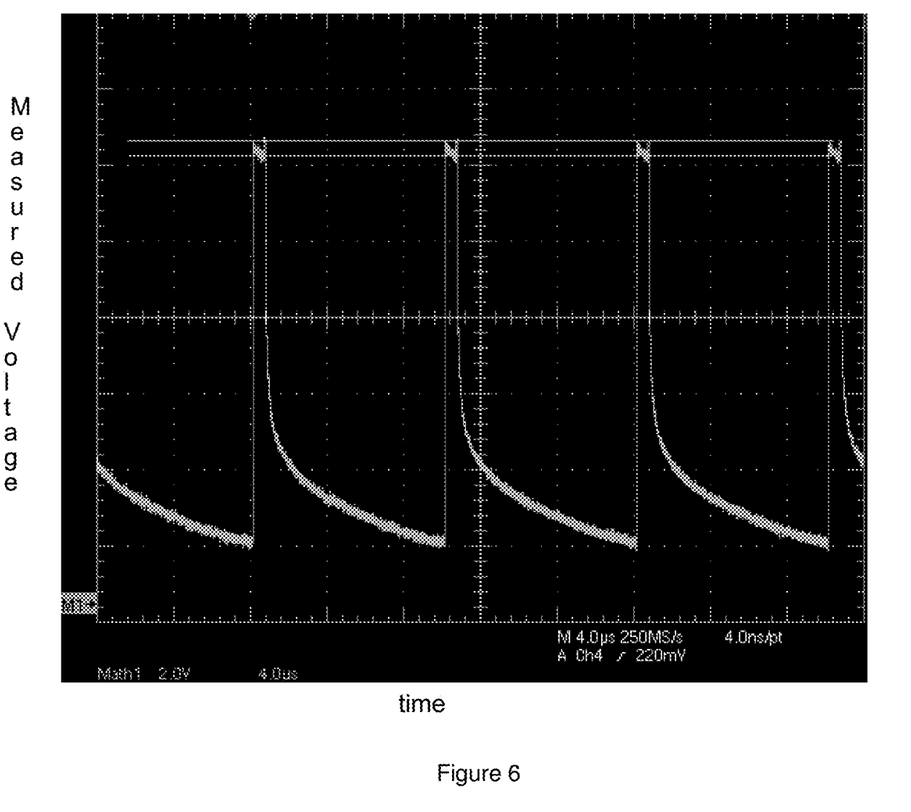
FIG. 6 is a graph that illustrates measured voltage as function of time for a quantum cascade device having a pulsed drive profile.

FIG. 6 is a graph that illustrates measured voltage as a function of time for a quantum cascade device that is powered with a pulsed drive profile. As illustrated in FIG. 6, when a pulsed drive profile with a standard repetition rate of 100 kHz is directed to the quantum cascade device by the laser driver 14A (illustrated in FIG. 1A), the voltage across the active region never returns all the way to zero. In FIG. 6, zero volts is indicated by "M1". Further, a significant voltage is present at all times the quantum cascade device is being pulsed, even though the fraction of time light is being emitted is much lower.

In the example illustrated in FIG. 6, the pulsing conditions of the quantum cascade device are (i) 100 kilohertz repetition rate, (ii) 700 nanosecond wide voltage pulses applied, and (iii) a peak voltage of 12.16 volts.

Figure 7:
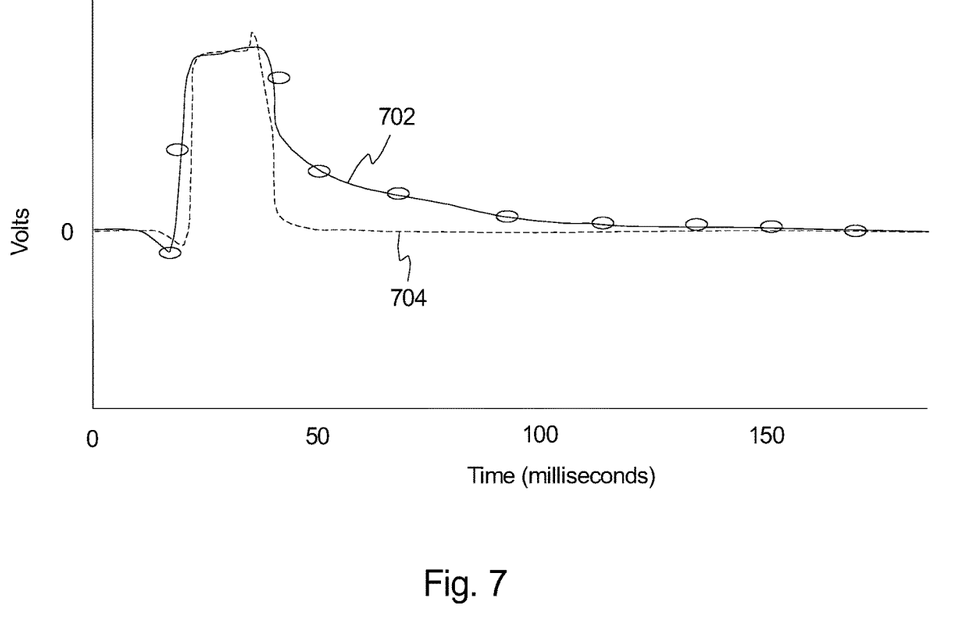
FIG. 7 is a graph that illustrates a simulated voltage across the active area of the quantum cascade device, and an ideal voltage across the active area of the quantum cascade device during a pulse drive voltage to the quantum cascade device.

FIG. 7 is a graph that includes (i) a first curve 702 (solid trace with small ovals) that represents a simulated voltage across an active area of a quantum cascade device before, during, and after a voltage pulse, and (ii) a second curve 704 (dashed trace) that represents an ideal voltage across the active area of the quantum cascade device before, during, and after the voltage pulse. The data for the simulated voltage across the active area was generated using an equivalent circuit for the quantum cascade device.

As provided herein, using the equivalent circuit, it is possible to reproduce the slow decay in voltage in the quantum cascade device between fast voltage pulses to the quantum cascade device. The second curve 704 in FIG. 7 shows the ideal voltage response of the quantum cascade device, while the first curve 702 shows the actual slow voltage decay after the driving voltage pulse is complete, consistent with the observations shown in FIG. 6. This is due entirely to the increasing resistance in the quantum cascade device with decreasing voltage. The slow decay of voltage (difference between the two curves 702, 704) when the device is nominally off and not emitting light has two bad effects. First, it increases the overall power consumption of the quantum cascade device, even when trying to conserve power using a pulsed paradigm. Secondly, the residual voltage creates heating in the active area that reduces the overall light production efficiency for the same driving current. In general, higher temperatures in the active region provide phonon assisted pathways for the electrons that defeat the light generation mechanism of the quantum cascade. Simulations suggest that this residual power consumption and heating reduce the efficiency of the quantum cascade device for light production by as much as forty percent.

As provided above, with reference to FIG. 1A, the laser driver 14A can control the voltage to the quantum cascade device 12 in a pulsed fashion that improves the slow decay of voltage when the quantum cascade device 12 is nominally off in order to reduce thermal load and power consumption of the quantum cascade device 12.

Figure 8:
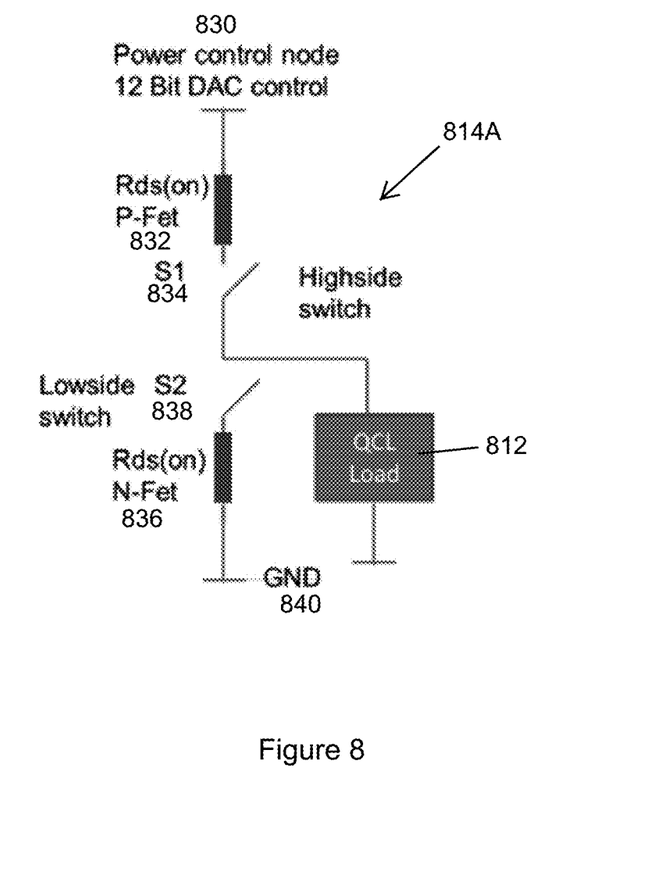
FIG. 8 is a simplified illustration of a portion of a drive circuit having features of the present invention, and a quantum cascade device.

FIG. 8 is a simplified illustration of a portion of a laser driver circuit 814A that directs a pulsed drive profile to the quantum cascade device 812 in a fashion that is more efficient and results in lower thermal load and power consumption of the quantum cascade device 812. In this non-exclusive embodiment, the laser driver circuit 814A includes (i) a power supply 830 (e.g. a 12 Bit DAC control power control node); (ii) a highside field effect transistor (Rds (on) P-FET) 832; (iii) a highside switch S1 834; (iv) a lowside field effect transistor (Rds(on)N-FET) 836; (v) a lowside switch S2 838; and (vi) a ground 840.

In this embodiment, the laser drive circuit 814A can direct a pulsed voltage drive profile to the quantum cascade device 812 that includes a plurality of voltage pluses that are spaced apart by time segments in which the drive circuit 814A pulls down the voltage in the quantum cascade device 812. Stated in another fashion, the pulsed voltage drive profile can include a plurality of spaced apart on-time segments in which the laser driver circuit 814A directs voltage to the quantum cascade device, and a plurality of off-time segments in which the laser driver 814A actively pulls down the voltage from the quantum cascade device 812. In this design, the off-time segments are interspersed with the on-time segments.

With the laser drive circuit 814A illustrated in FIG. 8, during each voltage pulse, the highside switch 834 is closed via the highside field effect transistor 832, the lowside switch 838 is opened via the lowside field effect transistor 836, and the power supply 830 directs the voltage pulse to the quantum cascade device 812. Further, between each voltage pulse, the highside switch 834 is opened via the highside field effect transistor 832, the lowside switch 838 is closed via the lowside field effect transistor 836, and the voltage in the quantum cascade device 812 drained to ground 840.

Stated in another fashion, to provide each voltage pulse, the highside field effect transistor 832 closes the highside switch 834, the lowside field effect transistor 836 opens the lowside switch 838, and the power supply 830 directs the voltage pulse to the quantum cascade device 812. Further, between each voltage pulse, the highside field effect transistor 832 opens the highside switch 834, and the lowside field effect transistor 836 closes the lowside switch 838 to rapidly remove the residual charge and voltage across the active area of the quantum cascade active area. Closing the lowside switch 838 and opening the highside switch 834 in the laser drive circuit 914A immediately after the voltage pulse that creates the optical energy is complete, allows the remaining voltage across the quantum cascade device 812 to be shunted to ground 840, thus avoiding the residual heating that reduces the efficiency of the quantum cascade device 812. Timing is critical for non-overlapping switching. That is, (i) the highside switch 834 is opened immediately before the lowside switch 838 is closed to pull down the voltage in the quantum cascade device 812; and (ii) the lowside switch 838 is opened immediately before the highside switch 834 is closed to apply the voltage pulse to the quantum cascade device 812.

The laser drive circuit 814A illustrated in FIG. 8 is a complimentary drive yielding symmetric driving point impedance (Rds(on) P-FET and Rds(on)N-FET). This type of circuit is used to drive the quantum cascade device 812 with active pull-down of the voltage immediately after the desired drive pulse.

Figure 9:
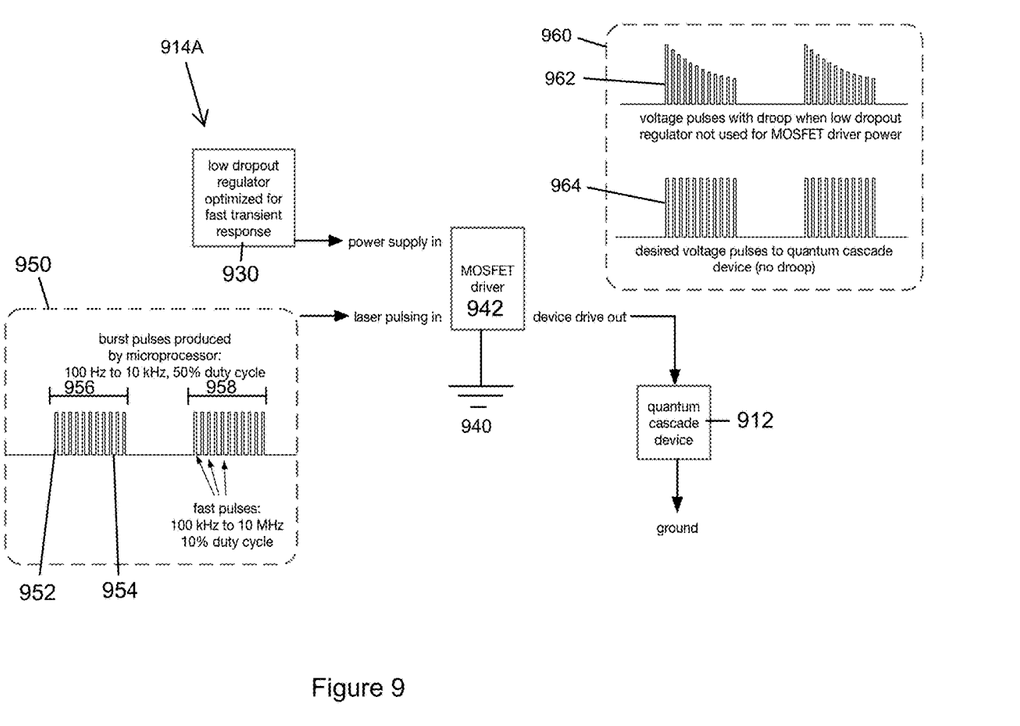
FIG. 9 is a simplified schematic of a drive circuit having features of the present invention, and a quantum cascade device.

FIG. 9 illustrates another non-exclusive, more complete embodiment of a laser drive circuit 914A for directing voltage to the quantum cascade device 912 with active voltage pull-down. With this design, the laser drive circuit 914A directs voltage to the quantum cascade device 912 in a fashion that improves the slow decay of voltage when the quantum cascade device 912 is nominally off in order to reduce thermal load and power consumption. This will reduce power consumption and improve laser efficiency due to the cooler active area of the quantum cascade device 912. This will also reduce the thermal load on the temperature management system 18A (illustrated in FIG. 1A).

In the laser drive circuit 914A illustrated in FIG. 9, a metal-oxide semiconductor field-effect transistor ("MOSFET") driver 942 is used to direct each voltage pulse to the quantum cascade device 912, and actively pull-down the voltage in the quantum cascade device 912 between each voltage pulse. The MOSFET driver 942 provides fast voltage pulses (e.g. 100 kHz to 10 MHz) and fast, active voltage pull-downs between the voltage pulses. With this design, all of the issues of timing for switching the highside field effect transistor 832 and the lowside field effect transistor 836 illustrated in FIG. 8 are handled by the integrated circuits of the MOSFET driver 942. As a non-exclusive example, a suitable MOSFET driver 942 can include those from MICREL (MIC4126/27/28 series of devices).

FIG. 9 also includes a non-exclusive, simplified, non-exclusive example of a suitable pulsed voltage drive profile 950 that is directed to the MOSFET driver 942. In this embodiment, the voltage drive profile 950 includes a first set 956 of voltage pulses and a second set 958 of voltage pulses that are spaced apart in time. Alternatively, the voltage drive profile 950 can include a single set or more than two sets of voltage pulses.

For the pulsed voltage drive profile 950 of FIG. 9, each set 956, 958 includes a plurality of alternating on-time segments 952 and off-time segments 954. During each on-time segment 952, a voltage pulse of sufficient voltage is directed to the quantum cascade device 912 to generate the output beam. Further, during each off-time segment 954, the voltage is shunted to ground 940 to pull down the voltage to the quantum cascade device 912 to approximately zero between the voltage pulses.

The number of on-time segments 952 and off-time segments 954 in each pulsed set 956, 958 can be varied to suit the requirements of the quantum cascade device 912. In the non-exclusive example illustrated in FIG. 9, each set 956, 958 includes eleven on-time segments (pulses) 952 and eleven off-time segments 954. Alternatively, each set 956, 958 can include more than eleven or fewer than eleven on-time segments 952 and off-time segments 954. Stated in another fashion, as non-exclusive examples, the number of pulses in each set 956, 958 can be include approximately 1, 2, 5, 10, 30, 50, 75, 100, 200, 300, 500, 1000, 2000, 10000, 15000, 20000, or 30000 separate pulses.

The duration of each on-time segment 952 and off-time segment 954 can be varied to suit the requirements of the quantum cascade device 912. As alternative non-exclusive embodiments, each on-time segment 952 and off-time segment 954 has a duration of approximately 1, 10, 25, 50, 75, 100, 150, 200, 300, 400, 500, 600 or 1000 nanoseconds. Stated in another fashion, as alternative non-exclusive examples, each set 956, 958 can have frequency of between approximately ten kHz and ten MHz.

Further, the duration of each on-time segment 952 can be equal to, less than, or greater than each off-time segment 954. In one embodiment, for each set 956, 958, each on-time segment 952 is equal to each off-time segment 954. This results in a fifty percent duty cycle for each set 956, 958. As alternative, non-exclusive examples, each set 956, 958 can have a duty cycle of 10, 20, 30, 40, 60, 70, 80 or 90 percent.

It should be noted that for the drive profile 950 illustrated in FIG. 9, the sets 956, 958 are spaced apart and the drive profile 950 has an overall duty cycle of ten percent. As alternative, non-exclusive embodiments, the drive profile 950 can have a duty cycle of 1, 5, 20, 30, 40, 50, 60, 70, 80 or 90 percent.

During each on-time segment 952, the laser drive circuit 930 directs sufficient voltage to the quantum cascade device 912 to generate light. The magnitude of the required sufficient voltage will depend on the design of the quantum cascade device 912. As a non-exclusive embodiments, the sufficient voltage is at least 8, 9, 10, 11, 12, 13, 14, 15, 16, 17, 18, 19, or 20 volts.

In certain embodiments, the power supply 930 includes a low dropout power regulator that is optimized for fast transient response to reduce the effects of fast transient, or burst pulsing. In contrast, a standard power supply (not shown) has bandwidth limitations built into it to reduce power supply noise. With the standard power supply, this means that the power supply cannot respond to fast transient requests (100 Hz to 10 kHz) necessary to create the pulse envelopes, or burst pulses, desired for some applications using quantum cascade devices 912. Thus, as provided herein, the power supply 930 can include the low dropout regulator optimized for fast transient response. A non-exclusive example of a suitable regulator 930 is the LT1764 series of regulators from Linear Technology. These are typically used for RF supply applications, but are ideal for ensuring that the voltage drive pulse to the quantum cascade device 912 does not drop by more than a few percent over tens of microseconds, even after initial turn on of the quantum cascade device 912.

FIG. 9 also includes an inset 960 which illustrates the voltage that is directed to the quantum cascade device 912 when a low dropout regulator is not used for the power supply 930, and when a low dropout regulator is used for the power supply 930. More specifically, the insert 960 includes (i) an upper voltage profile 962 that illustrates that the voltage pulses will droop over time when a standard power supply without the low dropout regulator is used in the power supply 930; and (ii) a lower voltage profile 964 that illustrates that the voltage pulses do not droop over time when a low dropout regulator is used for the power supply 930. Thus, the power supply 930 with a low dropout power regulator can be precision regulated for fast transient current load regulation. This power management architecture enables pulse trains with constant envelope waveform shape. Laser power pulse repeatability is key metrics for signal fidelity and laser light noise reduction.

While the particular designs as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. A laser assembly that generates a pulsed output beam, the laser assembly comprising:
   a quantum cascade device; and
   a laser driver that controls the voltage to the quantum cascade device in a pulsed drive profile to generate the pulsed output beam, the pulsed drive profile including a plurality of spaced on-time segments in which the laser driver directs voltage to the quantum cascade device, and a plurality of spaced apart off-time segments in which the laser driver actively pulls down the voltage from the quantum cascade device to reduce the voltage in the quantum cascade device and reduce the heat generated; wherein the off-time segments are interspersed between on-time segments; wherein the laser driver includes a first field-effect transistor (FET) driver for directing voltage to the quantum cascade device during each on-time segment, and a second field-effect transistor (FET) that pulls down the voltage in the quantum cascade device during the off-time segment.

2. The laser assembly of claim 1 wherein the laser driver pulls down the voltage in the quantum cascade device to approximately zero during each of the off-time segments.

3. The laser assembly of claim 1 wherein the laser driver pulls down the voltage in the quantum cascade device to approximately zero during at least one of the off-time segments.

4. The laser assembly of claim 1 wherein the laser driver includes a metal-oxide-semiconductor field-effect transistor (MOSFET) driver for directing voltage to the quantum cascade device during each on-time segment, and pulling down the voltage in the quantum cascade device during each off-time segment.

5. The laser assembly of claim 1 wherein the laser driver includes a power supply having a low dropout regulator optimized for fast transient response for directing voltage to the quantum cascade device during each on-time segment.

6. A method for generating a pulsed output beam comprising:
   providing a quantum cascade device; and
   directing voltage to the quantum cascade device in a pulsed drive profile to generate the pulsed output beam with a laser driver, the pulsed drive profile including a plurality of spaced on-time segments in which the laser driver directs voltage to the quantum cascade device, and a plurality of spaced apart off-time segments in which the laser driver pulls down the voltage from the quantum cascade device to reduce the voltage in the quantum cascade device and reduce the heat generated; wherein the off-time segments are interspersed between on-time segments; wherein the laser driver includes a first field-effect transistor (FET) driver for directing voltage to the quantum cascade device during each on-time segment, and a second field-effect transistor (FET) that pulls down the voltage in the quantum cascade device during the off-time segment.

7. The method of claim 6 wherein the step of directing includes the laser driver pulling down the voltage in the quantum cascade device to approximately zero during each of the off-time segments.

8. The method of claim 6 wherein the step of directing includes the laser driver pulling down the voltage in the quantum cascade device to approximately zero during at least one of the off-time segments.

9. The method of claim 6 wherein the step of directing includes the laser driver having a metal-oxide-semiconductor field-effect transistor (MOSFET) driver for directing voltage to the quantum cascade device during each on-time segment, and pulling down the voltage in the quantum cascade device during each off-time segment.

10. The method of claim 6 wherein the step of directing includes the laser driver having a power supply having a low dropout regulator optimized for fast transient response for directing voltage to the quantum cascade device during each on-time segment.

* * * * *